United States Patent
Akane et al.

(10) Patent No.: US 6,972,511 B2
(45) Date of Patent: Dec. 6, 2005

(54) QUARTZ-CRYSTAL UNIT

(75) Inventors: Katsunori Akane, Saitama (JP); Kiyoharu Matsuo, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/301,104

(22) Filed: Nov. 21, 2002

(65) Prior Publication Data

US 2003/0111935 A1 Jun. 19, 2003

(30) Foreign Application Priority Data

Nov. 22, 2001 (JP) .......... 2001-357926

(51) Int. Cl.[7] .......... H01L 41/08; H01L 41/18; H02N 2/00

(52) U.S. Cl. .......... 310/348
(58) Field of Search .......... 310/348

Primary Examiner—Thomas M. Dougherty
Assistant Examiner—J. Aguirrechea
(74) Attorney, Agent, or Firm—Katten Muchin Zavis Rosenman

(57) ABSTRACT

A quartz-crystal unit comprises a container body having a recess, a quartz-crystal blank having a pair of excitation electrodes respectively disposed on one and the other principal surfaces, and a pair of extending electrodes respectively extended from the pair of excitation electrodes, and a cover for sealing an opening plane of the recess. The extending electrodes are led to both sides of one end of the crystal blank, and the one end is secured by a conductive adhesive to hold the crystal blank in the recess in parallel to the cover. The crystal unit satisfies $0<d/L<0.64$, where L is the length from the one end to the other end opposing the one end in the crystal blank, and d is a gap between mutually opposing surfaces of the crystal blank and the cover.

8 Claims, 4 Drawing Sheets

QUARTZ-CRYSTAL UNIT

BACKGROUND OF THE INVENTION

1. Field of the Invention

The present invention relates to a surface-mount quartz-crystal unit, and more particularly, to a crystal unit which has a quartz-crystal blank held in a surface-mount container by securing the crystal blank at both side ends thereof to the container.

2. Description of the Related Arts

A crystal unit having a crystal blank held in a surface-mount container is employed in a variety of electronic devices particularly including portable communication devices as a frequency source and a temporal reference source therefor because of its small-size and light-weight feature. In recent years, surface-mount crystal units have been increasingly reduced in size, giving rise to an associated problem that the productivity becomes lower due to the need for meticulous works in fabricating the crystal units.

FIG. 1A is a cross-sectional view for explaining such a conventional crystal unit, and FIG. 1B is a plan view illustrating the crystal unit when cover 4 of container 1 is removed therefrom. The surface-mount crystal unit shown herein comprises surface-mount container 1, and crystal blank 2 hermetically encapsulated in container 1. Container 1 is composed of container body 3 made of a laminated ceramic and formed with a substantially rectangular recess on the top face thereof, and insulator cover 4 made of ceramic. Steps are formed in the recess.

Such container body 3 is made by laminating three layers of tabular or framed members. Specifically, container body 3 is composed of tabular bottom wall 6a; intermediate frame wall 6b corresponding to the steps in the recess; and top wall 6c corresponding to a portion above the steps in the recess. A pair of mounting electrodes 5 are formed on the outer face of bottom wall 6a for use in mounting the crystal unit on a wiring board. Intermediate frame wall 6b and top wall 6c are both formed with a rectangular framed opening corresponding to the recess. In the recess, the steps are formed at left and right ends of the recess in the figure. The opening of intermediate frame wall 6b has a longitudinal length shorter than that of the opening of top wall 6c, corresponding to the steps, and also shorter than length L of crystal blank 2. As illustrated in FIG. 1B, the left-hand step in the figure is divided into two steps, each of which is formed with a connection terminal for use in electric connection with crystal blank 2. This pair of connection terminals are electrically connected to a pair of mounting electrodes 5, respectively, through via holes formed through bottom wall 6a and a wiring pattern formed on the recess. The step formed with one pair of connection terminals is called the "divided step".

Crystal blank 2 is, for example, an AT-cut quartz-crystal blank substantially in rectangular shape. A pair of excitation electrodes 7 are formed on both principal surfaces of crystal blank 2, respectively. From a pair of excitation electrodes 7, extending electrodes 8a, 8b are respectively extended to both ends of one shorter side of crystal blank 2. Each of extending electrodes 8a, 8b is folded back on the opposite surface of crystal blank 2. Both ends of the one shorter side of crystal blank 2, to which extending electrodes 8a, 8b are extended, are secured by conductive adhesive 9 to the connection terminals formed on the divided step in the recess of container body 3 as described above. In this way, crystal blank 2 is held in the recess of container body 3, and electrically and mechanically connected to the divided step. The other end portion of crystal blank 2 is arranged in close proximity to or in contact with the step opposing the divided step.

Conductive adhesive 9 is applied on the divided step of container body 3, and cured through thermosetting, after one end of crystal blank 2 is carried thereon. In this way, the lower face and side face of the one end of crystal blank 2 are secured by conductive adhesive 9. Cover 4 is bonded on the top face of upper wall 6c of container body 3 by sealing glass 10, to hermetically encapsulate crystal blank 2 in container body 3.

In the crystal unit as described above, crystal blank 2 held on both sides of a shorter side prevents a stress caused by shrunk conductive adhesive 9 due to thermosetting, particularly in the longitudinal direction of the crystal blank. Generally, in an AT-cut crystal blank, the frequency-temperature characteristic is represented by a cubic function. The prevention of the stress in the longitudinal direction of the crystal blank contributes to the maintenance of such frequency-temperature characteristic. A flexible adhesive may be selected for conductive adhesive 9.

When crystal blank 2 is shaped in convex by securing one end of crystal blank 2 to the divided step such that the other end of crystal blank 2 is in close proximity to or in contact with the step opposing the divided step, a central region of crystal blank 2 is prevented from coming into contact with the bottom face of the recess. When crystal blank 2 is planar, crystal blank 2 may be directly secured to the bottom face of the recess without forming the step in the recess. However, from a viewpoint of common use of parts, the recess having the steps as described above is also used even when a planar crystal blank piece is used.

However, the crystal unit in the foregoing structure has an increasingly reduced margin for internal dimensions of container body 3, i.e., internal dimensions of the recess with respect to the area of crystal blank 2 due to an incremental reduction in size of the crystal unit. For this reason, for example, when crystal blank 2 is attracted with vacuum, positioned to the divided step and the step opposing the divided step, and mounted on the divided step, a problem of lower workability arises due to the crystal blank 2 which may collide against the inner wall of container body 3.

To solve this problem, it is contemplated that the width of top wall 6c, for example, is reduced to increase the internal dimensions without changing external dimensions of crystal unit. However, according to experiments made by the inventors with a crystal unit fabricated by forming container body 3 having increased internal dimensions in the foregoing manner, mounting crystal blank 2 in container body 3, and subsequently placing cover 4 on container body 3, the oscillation frequency changes if the crystal unit is dropped, for example, on a concrete floor.

SUMMARY OF THE INVENTION

It is an object of the present invention to provide a surface-mount quartz-crystal unit which excels in shock resistance so that a change in frequency is limited before and after it is applied with a drop impact.

The object of the present invention is achieved by a crystal unit which includes a container body having a recess, a crystal blank having a pair of excitation electrodes respectively disposed on one and the other principal surfaces, and a pair of extending electrodes respectively extended from the pair of excitation electrodes, and a cover for sealing an opening plane of the recess. The extending electrodes are led to both sides of one end of the crystal blank, and the one end is secured by a conductive adhesive to hold the crystal blank in the recess in parallel to the cover. The crystal unit satisfies 0<d/L<0.064, where L is the length from the one end to the other end opposing the one end in the crystal blank, and d is a gap between mutually opposing surfaces of the crystal blank and the cover.

Now, description will be made on the result of an investigation made by the inventors for completing the present invention.

The inventors fabricated the conventional surface-mount crystal unit illustrated in FIGS. 1A and 1B, i.e., a crystal unit in which the recess in container body 3 had internal dimensions close to the dimensions of crystal blank 2, and crystal units which were improvements on the conventional surface-mount crystal unit. The improved crystal units included one which was reduced in the width of the frame of top wall 6c in the conventional crystal unit (see FIGS. 1A and 1B). The conventional crystal unit is designated as "Product Example 1"; and the improved crystal units as "Product Example 2".

Since Product Example 1 has top wall 6c, the width of which is larger than that of Product Example 2, glass 10 used for sealing cover 4 also has a larger width, causing inner inclination 10A of the glass to be positioned above the other end of crystal blank 2 within the container. On the contrary, in Product Example 2 which has the recess of increased internal dimensions, the top wall has a reduced width on both end sides so that the glass is applied over a smaller width for sealing. Cover 4 is positioned above the other end of crystal blank 2 without intervention of a glass layer because of the internal inclination of the glass formed in a reduced region as well as the increased internal dimensions of the recess.

Assume herein that the crystal units are applied with a drop impact. In Product Example 1, the other end of crystal blank 2 collides against glass inclination 10A, and swings between the step and glass inclination 10A. In Product Example 2, on the other hand, the other end of crystal blank 2 collides against insulating cover 4, and swings between the step and insulating cover 4. Therefore, in Product Example 2 which is an improvement on the conventional crystal unit, the other end of crystal blank 2 swings over a longer stroke than Product Example 1 which is identical to the conventional crystal unit.

Since the other end of crystal blank 2 swings over a longer stroke as described above, the crystal unit of Product Example 2 experiences a state change in conductive adhesive 9 applied on one end of crystal blank 2 for securing crystal blank 2 to the divided step, due to a stress generated in conductive adhesive 9. Such a state change occurs in a holding system for crystal blank 2 to apply an associated stress to crystal blank 2, resulting in a change in the oscillation frequency of crystal blank 2. Specifically, after the crystal unit is applied with a drop impact, the other end of crystal blank 2 comes closer to cover 4, so that the crystal blank 2 is held in an diagonally upward oriented posture. For this reason, the crystal unit of Product Example 2 experiences a change in the oscillation frequency after it is applied with a drop impact.

On the contrary, in the crystal unit of Product Example 1, since the other end of crystal blank collides against glass inclination 10A, the other end of crystal blank 2 swings over a shorter stroke. Seemingly, this results in a reduction in the state change in the holding system for crystal blank 2, thereby preventing a change in the oscillation frequency.

In this regard, the inventors diligently studied the foregoing results and reached the completion of the present invention described above. According to the present invention, when the ratio d/L of length L of crystal blank 2 and gap d between crystal blank 2 and cover 4 is set to satisfy 0<d/L<0.064, the other end of crystal blank 2 is forced to swing over a shorter stroke, thereby preventing the state change in conductive adhesive 9 applied on both sides of the one end of crystal blank 2. Consequently, this leads to prevention of fluctuations in the oscillation frequency before and after the crystal unit is applied with a drop impact, making the crystal oscillator excellent in shock resistance.

DETAILED DESCRIPTION OF THE INVENTION

Figure 1A:
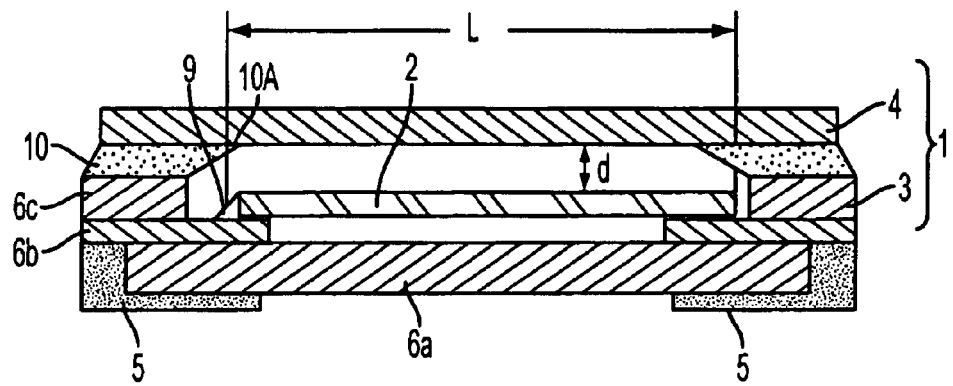
FIG. 1A is a cross-sectional view illustrating the structure of a conventional surface-mount crystal unit.
Figure 1B:
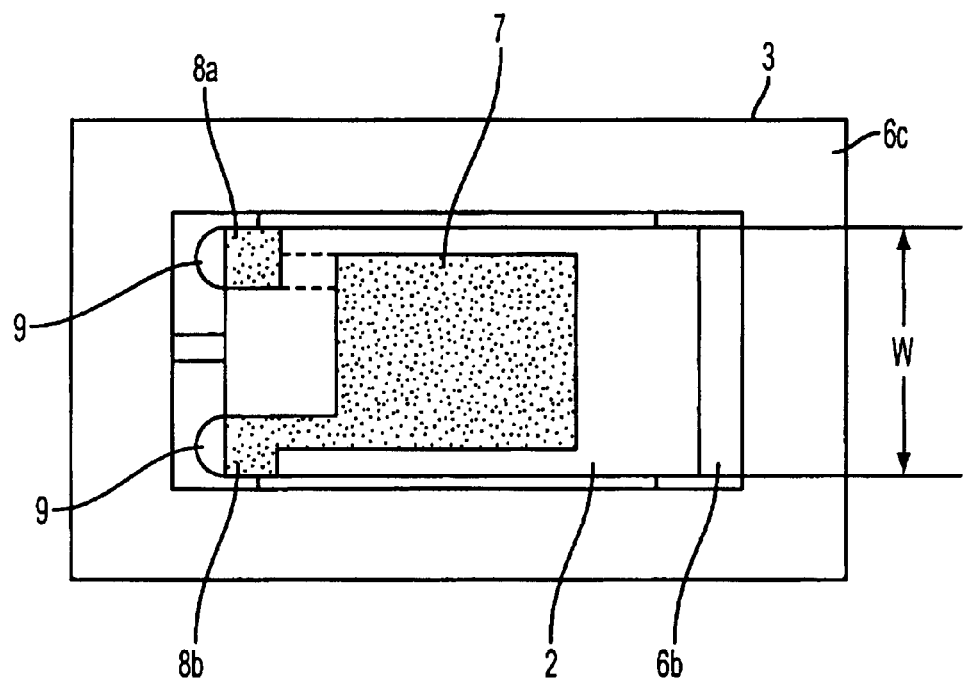
FIG. 1B is a plan view of the surface-mount crystal unit illustrated in FIG. 1A when a cover is removed therefrom.
Figure 2A:
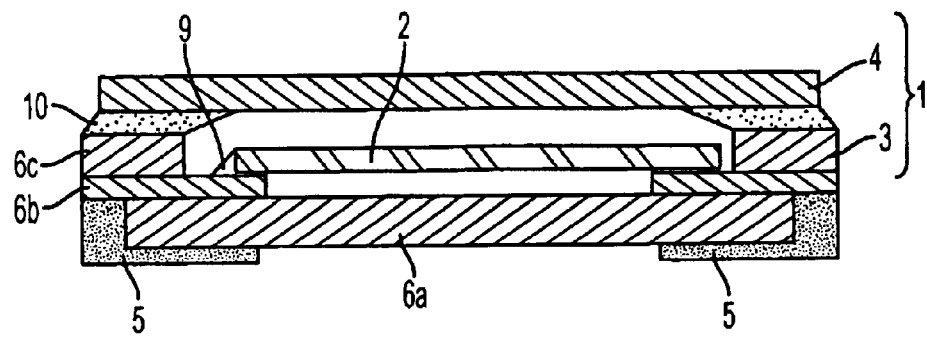
FIG. 2A is a cross-sectional view illustrating the structure of a surface-mount crystal unit according to one embodiment of the present invention.
Figure 2B:
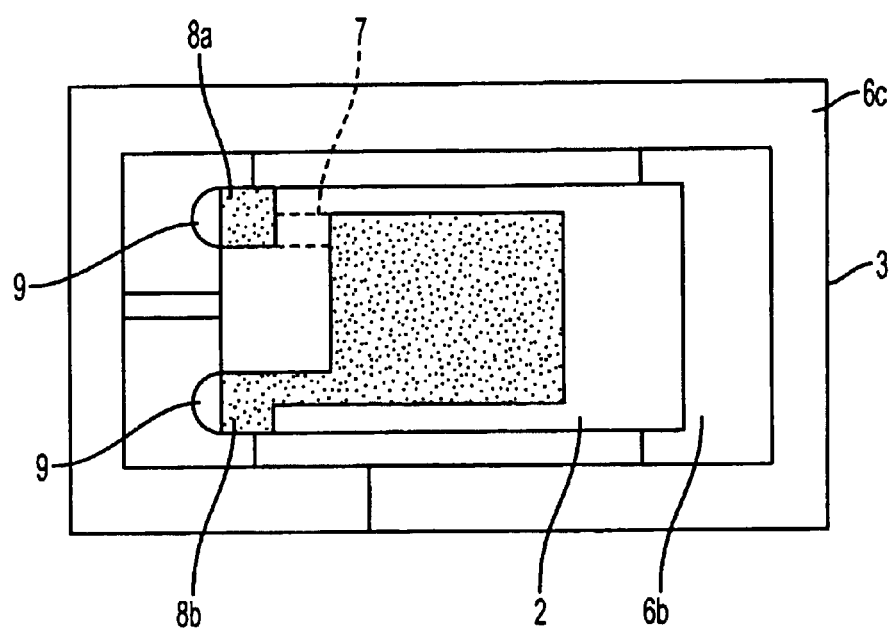
FIG. 2B is a plan view of the crystal unit illustrated in FIG. 2A when a cover is removed therefrom.

A surface-mount quartz-crystal unit according to one embodiment of the present invention illustrated in FIGS. 2A and 2B is similar in structure to the conventional crystal unit illustrated in FIGS. 1A and 1B, and comprises surface-mount container 1 composed of container body 3 having a recess and insulator cover 4 bonded to container body 3 by a sealing glass to cover the recess; and crystal blank 2 accommodated in container 1. In FIGS. 2A and 2B, members identical to those illustrated in FIGS. 1A and 1B are designated the same reference numerals, and the redundant description thereon is not repeated.

In this embodiment, container body 3 is composed of bottom wall 6a, intermediate frame wall 6b, and top wall 6c laminated one above the other, in a manner similar to the foregoing. However, unlike the conventional crystal unit, the crystal unit in this embodiment reduces the width of a frame portion of top wall 6c such that internal dimensions of the recess of container 1 are sufficiently larger than the area of crystal blank 2.

Crystal blank 2 substantially in rectangular shape is formed with a pair of excitation electrodes 7, and extending electrodes 8a, 8b extended to both ends of one shorter side of crystal blank 2, respectively. Crystal blank 2 has the end formed with extending electrodes 8a, 8b secured to the divided step of container body 3 with conductive adhesive 9, so that crystal blank 2 is held by container body 3. In this event, crystal blank 2 is held in parallel to cover 4. The other end of crystal blank 2 is in close proximity to or in contact with a step opposing the divided step in the recess.

In this crystal unit, unlike the conventional crystal unit illustrated in FIGS. 1A and 1B, cover 4 is directly placed above the other end of crystal blank 2 without intervention of glass layer 10. Assuming that a drop impact is applied to such a crystal unit, the other end of crystal blank 2 will not collide against inclination 10A of the sealing glass but against cover 4.

Also, in the crystal unit according to this embodiment, among the members which comprise container body 3, the thickness of top wall 6c is chosen to be the same as that of intermediate frame wall 6b. Assume herein that the thickness of intermediate frame wall 6b and top wall 6c is a minimum thickness of 150 $\mu$m in consideration of productivity. Generally, a green ceramic sheet for making the respective layers is set to have a thickness gradually increased from a minimum thickness of 150 $\mu$m in increments of 50 $\mu$m. In this respect, the thickness of intermediate frame wall was set to be 200 $\mu$m in a conventional typical crystal unit as illustrated in FIGS. 1A and 1B.

The crystal unit according to this embodiment thus set was actually fabricated, and designated as Example 1. In the crystal unit of Example 1, gap d between crystal blank 2 and cover 4 is 0.12 mm in additional consideration of the thickness of sealing glass 10. Also, crystal blank 2 in Example 1 is in the shape of a plate which has a length of 2.8 mm and a width of 1.3 mm, so that the ratio d/L is 0.043, where L is the length of crystal blank 2.

Apart from the crystal unit of Example 1, crystal units having different gap d between crystal blank 2 and cover 4 were fabricated and designated as Comparative Example 1 and Comparative Example 2, respectively. In Comparative Example 1, d was chosen to be 0.18 mm, i.e., d/L was set to 0.064, while in Comparative Example 2, d was chosen to be 0.24 mm, i.e., d/L was set to 0.086.

Figure 3A:
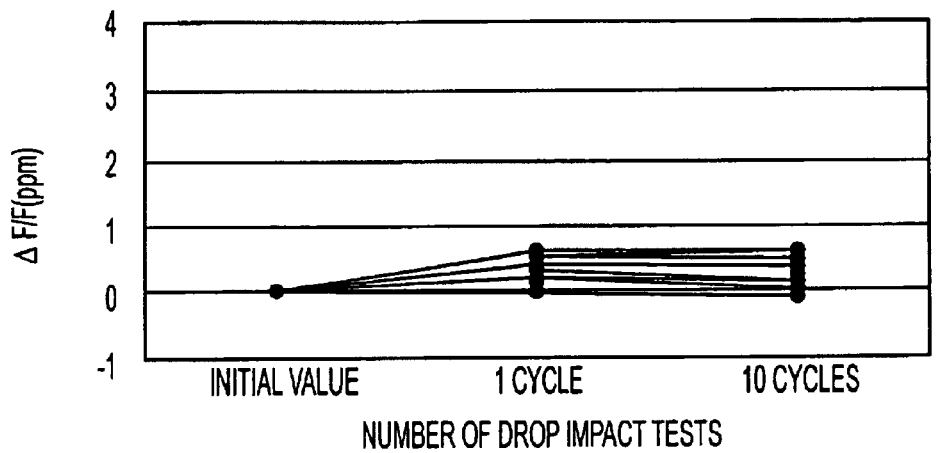
FIGS. 3A, 3B and 3C are graphs showing the shock resistance characteristics of crystal units of Example 1, Comparative Example 1, and Comparative Example 2, respectively.
Figure 3B:
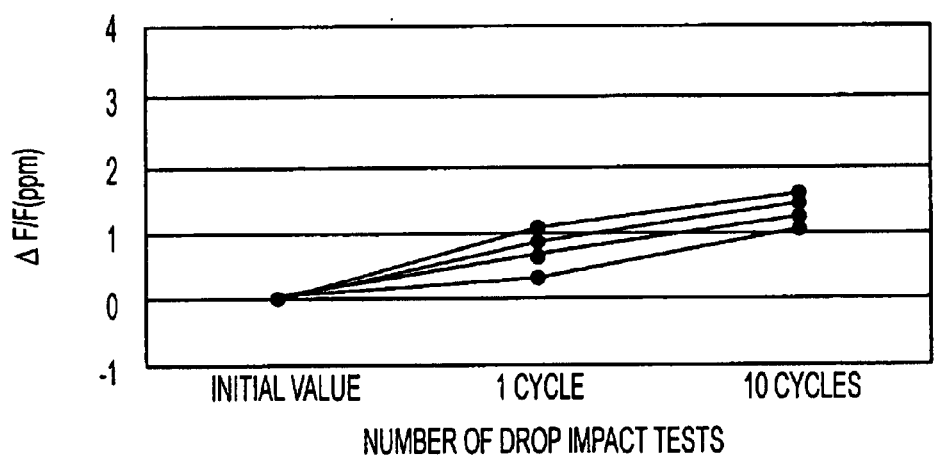
Figure 3C:
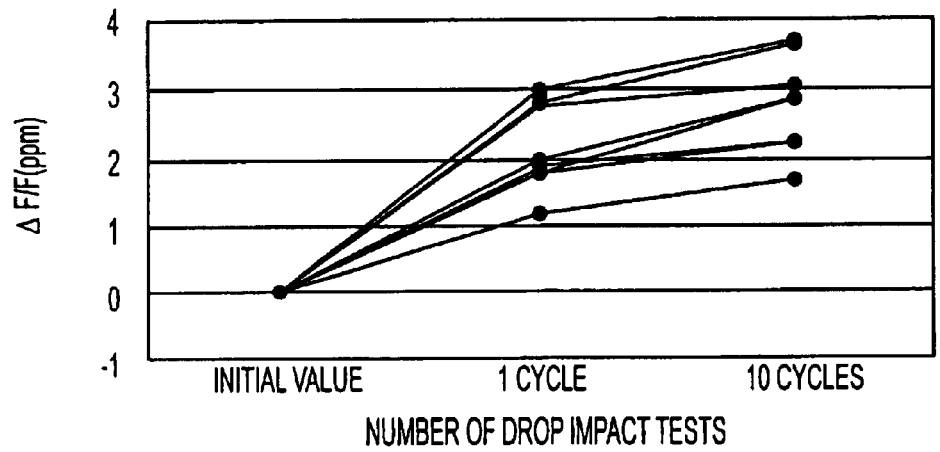

Each of the crystal units of Example 1, Comparative Example 1, and Comparative Example 2, fabricated in the foregoing manner, underwent a drop impact test to measure a change in oscillation frequency before and after the crystal unit was applied with a drop impact. In the drop impact test, the crystal units were dropped from 1.5 m above a concrete floor. A change in oscillation frequency before and after the drop is represented by frequency deviation $\Delta f/f$, where f is the oscillation frequency before the drop, and $\Delta f$ is a changing amount of the oscillation frequency before and after the drop. The result of the drop impact test thus conducted is shown in FIGS. 3A to 3C. FIG. 3A shows the result obtained from Example 1; FIG. 3B from Comparative Example 1; and FIG. 3C from Comparative Example 2.

The drop impact test involved dropping each crystal unit twice in the positive and negative directions along each of the X-, Y-, Z-axes. This sequence of operations was defined as one cycle, and ten cycles of testing operations were performed on each crystal unit. At the end of each cycle, the frequency deviation was measured. Ten samples, each has the nominal oscillation frequency of 13 MHz, were provided for each of Example 1 and Comparative Examples 1, 2. FIGS. 3A to 3C show a change in the frequency deviation at the end of each cycle in these samples, where the horizontal axis represents the test cycle.

As is apparent from the result of the drop impact test, Comparative Example 2 (d=0.24 mm, d/L=0.086) shown in FIG. 3C presents a frequency deviation in a range of approximately +1.7 to +3.6 ppm at the end of the tenth cycle, and subsequently, the change in the oscillation frequency saturates in general. When a tolerance for the change in the oscillation frequency is chosen to be, for example, ±2 ppm, the change in the oscillation frequency in Comparative Example 2 exceeds this tolerance.

Comparative Example 1 (d=0.18 mm, d/L=0.064) shown in FIG. 3B presents a frequency deviation in a range of +0.9 to +1.6 ppm at the end of tenth cycle and barely satisfies the aforementioned tolerance (±2 ppm).

Example 1 (d=0.12 mm, d/L=0.043) shown in FIG. 3A presents a frequency deviation in a range of −0.2 to +0.8 ppm in any of the first to tenth cycles, and successfully falls within the tolerance (±2 ppm). It is estimated that this satisfactory result was obtained because the other end of the crystal blank was limited in swinging stroke as described above, so that the conductive adhesive was prevented from deformation particularly at the one end of the crystal blank to limit a change in the holding system before and after the impact.

Figure 4:
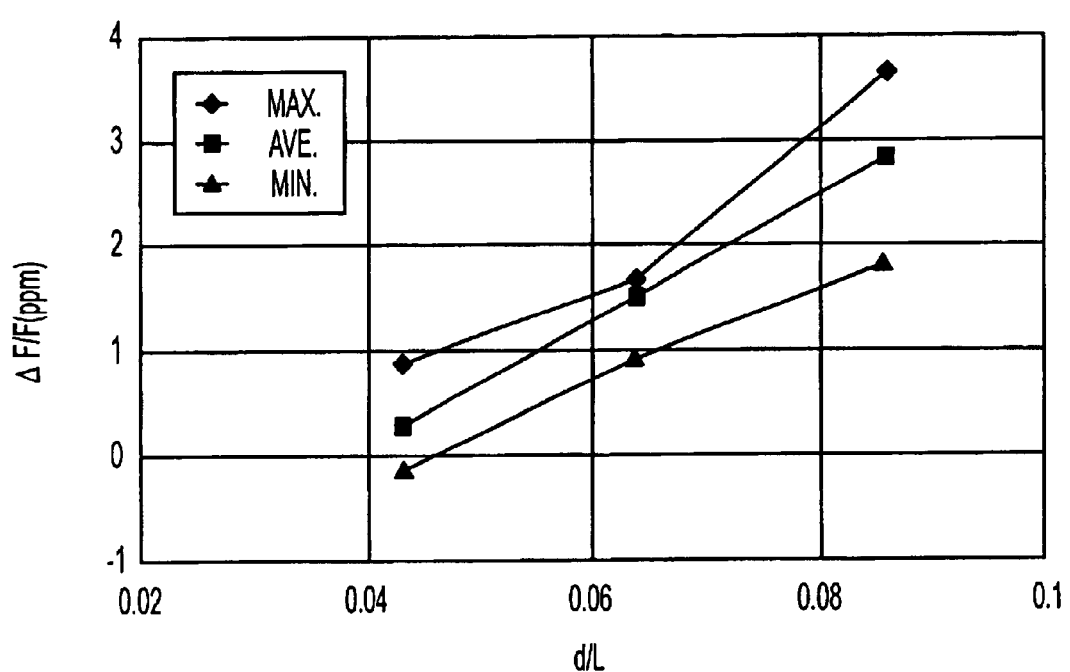
FIG. 4 is a graph showing the shock resistance characteristics of the crystal units of Example 1, Comparative Example 1, and Comparative Example 2 in comparison with one another.

FIG. 4 is a graph showing the relationship between maximum values (max.), minimum values (min.), and mean values (ave.) of frequency deviations $\Delta f/f$ calculated for Example 1 and Comparative Examples 1, 2 at the end of the tenth cycle, and gap d between the crystal blank and cover. As is apparent from the graph, gap d at which frequency deviation $\Delta f/f$ satisfies the aforementioned tolerance, i.e., within ±2 ppm is approximately within 0.18 mm. In other words, d/L is within 0.064. Stated another way, a crystal unit satisfies the tolerance stipulating that fluctuations in the oscillation frequency shall fall within ±2 ppm when gap d between the crystal blank and cover is within 0.18, i.e., d/L is within 0.064. In addition, when d/L is set to approximately 0.05 or less, the resulting crystal unit satisfies a more strict tolerance stipulating that fluctuations in the oscillation frequency shall fall within ±1 ppm.

Strictly, fluctuations in the oscillation frequency when the crystal unit is applied with a drop impact depend on absolute values of length L and width W of the crystal blank, the mechanical strength of the conductive adhesive, and the like. However, according to the investigations made by the inventors, the value d/L significantly affects fluctuations in the oscillation frequency when the crystal unit is applied with a drop impact. Therefore, for limiting the fluctuations in the oscillation frequency when a drop impact is applied, 0<d/L<0.064 should be satisfied, and preferably, 0<d/L<0.05 is satisfied. These ranges associated with the value d/L can be one of design criteria. With d/L=0.064, if the other end of the crystal blank comes into contact with the cover due to a drop impact, the other end is inclined upward by approximately 3.7 degrees, viewed from the one end of the crystal blank.

As described above, since the crystal unit according to the foregoing embodiment reduces the width of the frame portion of top wall 6c to increase the inner volume, a clearance created between the outer periphery of crystal blank 2 and top wall 6c facilitates positioning and the like of crystal blank 2 when it is accommodated in container body 3. In addition, since the thickness of top wall 6c is chosen to be equal to the minimum thickness of intermediate frame wall 6b, gap d can be reduced. With reduced gap d, crystal blank 2 swings over a shorter stroke even if the other end of crystal blank 2 swings between cover 4 and step when the crystal blank is applied with an impact. Thus, a state change is mitigated in conductive adhesive 9 on the one end side, permitting the crystal unit to maintain a high shock resistance.

While the foregoing embodiment employs a glass for sealing the opening of the recess of container body 3 with cover 4, the present invention is not limited to this particular material. Alternatively, a resin may be used as a sealant. Further, cover 4 may be made of metal, such that this cover may be bonded to container body 3 by seam welding, beam welding, or the like. Moreover, the present invention can be applied, similarly to the foregoing, to a surface-mount quarts-crystal oscillator which comprises a crystal unit (crystal blank 2) accommodated in the recess of container body 3, and an integrated circuit (IC) or the like, which makes up an oscillating circuit together with the crystal unit, disposed, for example, on the bottom of the recess together. The technical scope of the present invention encompasses arbitrary modifications including the foregoing.

What is claimed is:

1. A crystal unit comprising:

a container body having a recess;

a crystal blank having a pair of excitation electrodes respectively disposed on one and the other principal surfaces, and a pair of extending electrodes respectively extended from said pair of excitation electrodes; and a cover for sealing an opening plane of said recess, wherein:

said extending electrodes are led to both sides of one end of said crystal blank;

said one end is secured by a conductive adhesive to hold said crystal blank in said recess in parallel to said cover; and said crystal unit satisfies $0 < d/L < 0.064$, where L is the length from said one end to the other end opposing said one end in said crystal blank, and d is a gap between mutually opposing surfaces of said crystal blank and said cover.

2. The crystal unit according to claim 1, wherein said crystal unit satisfies $0 < d/L < 0.05$.

3. The crystal unit according to claim 1, wherein said container body and said cover are sealed with a glass, and said crystal unit has a structure which permits said other end of said crystal blank to collide against said cover when an impact is applied to said crystal unit.

4. The crystal unit according to claim 1, wherein said container body is a body portion of a surface-mount container.

5. The crystal unit according to claim 1, wherein said crystal blank has a substantially rectangular shape, and said one end and said other end are opposing shorter sides of said crystal blank.

6. The crystal unit according to claim 5, wherein said crystal unit satisfies $0 < d/L < 0.05$.

7. The crystal unit according to claim 5, wherein said recess includes a step formed therein, said one end being secured to said step.

8. The crystal unit according to claim 5, wherein said container body comprises a laminate of a bottom wall formed with mounting electrodes on an outer surface thereof, an intermediate frame wall having a substantially rectangular opening, said opening having a shorter side longer than the shorter side of said crystal blank and a long side shorter than a long side of said crystal blank, and a top wall having a rectangular opening of a size large enough to accommodate said crystal blank.

* * * * *